(12) United States Patent
Seok et al.

(10) Patent No.: US 9,059,418 B2
(45) Date of Patent: Jun. 16, 2015

(54) METHOD FOR MANUFACTURING A NANOSTRUCTURED INORGANIC/ORGANIC HETEROJUNCTION SOLAR CELL

(75) Inventors: Sang Il Seok, Daejeon (KR); Sang Hyuk Im, Daejeon (KR); Jeong Ah Chang, Daejeon (KR); Jae Hui Rhee, Daejeon (KR); Yong Hui Lee, Ulsan (KR); Hi Jung Kim, Gyeonggi-do (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 284 days.

(21) Appl. No.: 13/580,008

(22) PCT Filed: Feb. 18, 2011

(86) PCT No.: PCT/KR2011/001099
§ 371 (c)(1),
(2), (4) Date: Sep. 7, 2012

(87) PCT Pub. No.: WO2011/102677
PCT Pub. Date: Aug. 25, 2011

(65) Prior Publication Data
US 2013/0065354 A1    Mar. 14, 2013

(30) Foreign Application Priority Data
Feb. 18, 2010    (KR) .................. 10-2010-0014674

(51) Int. Cl.
*H01L 21/00*    (2006.01)
*H01L 51/40*    (2006.01)
(Continued)

(52) U.S. Cl.
CPC ......... *H01L 51/4226* (2013.01); *H01L 51/0036* (2013.01); *Y02E 10/542* (2013.01); *Y02E 10/549* (2013.01)

(58) Field of Classification Search
None
See application file for complete search history.

(56) References Cited

U.S. PATENT DOCUMENTS

2006/0160265 A1    7/2006  Morii et al.
2008/0110494 A1*   5/2008  Reddy ........................... 136/255
(Continued)

FOREIGN PATENT DOCUMENTS

EP    1176646 A1    1/2002
JP    2004221495 A   8/2004
(Continued)

OTHER PUBLICATIONS

Bach et al., Solid-state dye-sensitized mesoporous TiO2 solar cells with high photon-to-electron conversion efficiencies, Nature, Oct. 8, 1998, pp. 583-585, vol. 395.
(Continued)

*Primary Examiner* — Calvin Choi
(74) *Attorney, Agent, or Firm* — The Webb Law Firm

(57) ABSTRACT

Provided is a method for manufacturing a significantly high efficient solar cell having a novel structure and superior stability, and which can be mass-produced from an inexpensive material from an inexpensive material for enabling the easy commercial availability thereof. More particularly, the method of the present invention comprises the following step: (a) depositing slurry containing metal oxide particles and heat-treating the slurry to form a porous electron transporting layer; (b) forming inorganic semiconductors on surfaces of the metal oxide particles for the porous electron-transporting layer; and (c) impregnating the porous electron-transporting layer having the inorganic semiconductor formed thereon with a solution containing an organic photovoltaic material so as to form a hole transporting layer.

10 Claims, 7 Drawing Sheets

(51) Int. Cl.
*H01L 51/42* (2006.01)
*H01L 51/00* (2006.01)

(56) References Cited

U.S. PATENT DOCUMENTS

| | | |
|---|---|---|
| 2008/0236663 A1* | 10/2008 | Tanabe et al. ............ 136/256 |
| 2009/0114273 A1 | 5/2009 | Kamat |
| 2009/0314350 A1 | 12/2009 | Jung et al. |
| 2010/0043874 A1 | 2/2010 | Liu |
| 2011/0049504 A1 | 3/2011 | Kato |
| 2012/0132267 A1 | 5/2012 | Shinohara et al. |

FOREIGN PATENT DOCUMENTS

| | | |
|---|---|---|
| JP | 2004228450 A | 8/2004 |
| JP | 2006279018 A | 10/2006 |
| JP | 2008176997 A | 7/2008 |
| JP | 2008176998 A | 7/2008 |
| KR | 1020080028783 A | 4/2008 |
| KR | 1020080097462 A | 11/2008 |
| KR | 1020090124094 A | 12/2009 |
| KR | 1020090131461 A | 12/2009 |
| WO | 2009139487 A1 | 11/2009 |

OTHER PUBLICATIONS

Chang et al., High-Performance Nanostructured Inorganic-Organic Heterojunction Solar Cells, Nano Lett, 2010, pp. 2609-2612, vol. 10.
Chen et al., Polymer solar cells with enhanced open-circuit voltage and efficiency, Nature Photonics, Nov. 2009, pp. 649-653, vol. 3.
Itzhaik et al., Sb2S3-Sensitized Nanoporous TiO2 Solar Cells, The Journal of Physical Chemistry Letters, 2009, pp. 4254-4256, vol. 113.
Lee et al., Efficient CdSe Quantum Dot-Sensitized Solar Cells Prepared by an Improved Succesive Ionic Layer Adsorption and Reaction Process, Nano Letters, 2009, pp. 4221-4227, vol. 9, No. 12.
Moon et al., Sb2S3-Based Mesoscopic Solar Cell using an Organic Hole Conductor, The Journal of Physical Chemistry Letters, 2010, pp. 1524-1527, vol. 1.
Mor et al., Visible to Near-Infrared Light Harvesting in TiO2 Nanotube Array-P3HT Based Heterojunction Solar Cells, Nano Letters, 2009, pp. 4250-4257, vol. 9, No. 12.
Huynh et al., Hybrid Nanorod-Polymer Solar Cells, Science, Mar. 29, 2002, vol. 295, pp. 2425-2427.

* cited by examiner (a)

(b)

○ : Metallic Oxide Particle (31)
● : Inorganic semiconducor (40)

(c) Porous Electron Transporting Layer

30

METHOD FOR MANUFACTURING A NANOSTRUCTURED INORGANIC/ORGANIC HETEROJUNCTION SOLAR CELL

TECHNICAL FIELD

The following disclosure relates to an all-solid state nanostructured inorganic-organic heterojunction solar cell, and a method of manufacturing the same, and particularly, to a new solar cell having high efficiency and excellent stability according to time and manufactured at low cost using an inexpensive material and an inexpensive process by combining an advantage of an inorganic thin-film solar cell capable of easily absorbing solar energy of a wide band from visible light to near infrared light and an advantage of an organic solar cell capable of being manufactured at a low cost by a solution process with a structure of a dye-sensitized solar cell (DSSC) that is cheap and has high efficiency, and a method of manufacturing the same.

BACKGROUND ART

In order to solve exhaustion of fossil energy and environmental problems due to using fossil energy, research into alternative energy source such as solar energy, wind energy, and hydro energy that is renewable and clean has been actively conducted.

Of those, an interest in a solar cell directly converting solar light into electric energy has significantly increased. Here, the solar cell means a cell generating current-voltage using a photovoltaic effect in which the cell absorbs light energy from solar light to generate electrons and holes.

Recently, a n-p diode type single-crystalline silicon (Si) based solar cell having photoelectric conversion efficiency higher than 20% may be manufactured and actually has been used in solar power generation, and a solar cell using a compound semiconductor such as GaAs having conversion efficiency higher than that of the n-p diode type single-crystalline silicon (Si) based solar cell is present. However, since these inorganic semiconductors based solar cells require a significantly high-purity purified material for high efficiency, a large amount of energy is consumed in purifying a raw material, and expensive processing equipment is required during a single crystallization process or a thinning process using the raw material, such that there is a limitation in lowering a manufacturing cost of the solar cell, thereby blocking large-scale use of the solar cell.

Therefore, in order to manufacture the solar cell at low cost, a cost of a core material used in the solar cell or the manufacturing process of the solar cell should be greatly reduced, and research into a dye-sensitized solar cell (DSSC) and an organic solar cell that may be manufactured using an inexpensive material and process has been actively conducted as an alternative to the inorganic semiconductor based solar cell.

The dye-sensitized solar cell (DSSC) was initially developed by Michael Gratzel in 1991, a professor at EPFL in Switzerland and was reported in Nature (Vol 353, P. 737).

An early DSSC had a simple structure in which a dye absorbing light was absorbed on porous photo-anodes on a transparent electrode film through which light and electricity flow, another conductive glass substrate was positioned under the film, and a liquid electrolyte was filled therebetween.

An operation principle of the DSSC is as follows. When dye molecules chemically absorbed on surfaces of the porous photo-anodes absorb solar light, the dye molecules generate electron-hole pairs, and electrons are injected into a conduction band of semiconducting oxides used as the porous photo-anodes to be transported to the transparent conductive film, thereby generating current. The holes remaining in the dye molecules configure of complete solar cell circuits in a shape in which the holes are transported to photo-cathodes by hole conduction caused by oxidation-reduction reaction of a liquid or solid electrolyte or hole-conductive polymer, thereby performing external work.

In this DSSC configuration, the transparent conductive film was mainly made of fluorine doped tin oxide (FTO) or indium doped tin oxide (ITO), and nanoparticles having a broad band gap are used as the porous photo-anodes. In this case, a factor to be firstly considered at the time of selecting nano semiconducting oxides (photo-anodes) for the DSSC is an energy value of the conduction band. Oxides studied up to now is mainly $TiO_2$, $SnO_2$, $ZnO$, $Nb_2O_5$, or the like. It is known that a material having the highest efficiency among these materials up to now is $TiO_2$.

As the dye, various materials capable of absorbing light particularly well and easily separating an exciton generated by the light since a lowest unoccupied molecular orbital (LUMO) energy level of the dye is higher than an energy level of the conduction band of the photo-anode material to thereby increase the efficiency of the solar cell are chemically synthesized and used. The maximum efficiency of a liquid type DSSC reported up to now has been 11 to 12% for 20 years. The liquid type DSSC has relatively high efficiency to thereby make it possible to be commercialized. However, there are problems in stability according to time by a volatile liquid electrolyte and reducing cost due to using a high-cost ruthenium (Ru) based dye.

In order to solve these problems, research into uses of a non-volatile electrolyte using ionic solvent rather than the volatile liquid electrolyte, a gel-type polymer electrolyte, and an inexpensive pure organic dye has been conducted, but efficiency of a DSSC using these materials is lower than that of the DSSC using the volatile liquid electrolyte and Ru based dye.

Meanwhile, the organic photovoltaic (OPV) that has been studied in earnest since the mid-1990 is configured of organic materials having electron donor (D, or often called a hole acceptor) characteristics and electron acceptor (A) characteristics. When the solar cell made of organic molecules absorbs the light, electrons and holes are formed, which are called exciton.

The exciton moves to a D-A interface, such that an electric charge is separated, an electron moves to the electric acceptor, and the hole moves to the electron donor, thereby generating photo current. Examples of combination of materials mainly used in the organic photovoltaic include an organic (D)—fullerene (A) based material, an organic (D)—organic (A) based material, an organic (D)—nano-inorganic (A) based material, and the like.

Since a distance at which the exciton generated in the electron donor may move is about 10 nm, which is significantly short, photo active organic materials may not be thickly laminated, such that optical absorption spectra was low and the efficiency was low. However, recently, due to introduction of so-called bulk heterojunction (BHJ) concept of increasing a surface area at an interface and development of an electron donor organic material having a small band gap to easily absorb solar light of a wide range, the efficiency was significantly increased, such that an organic photovoltaic having efficiency of 6.77% has been reported (Nature Photonics, Vol3, p. 649).

In the organic photovoltaic, a manufacturing process of a cell is simple due to high formability of the organic material, diversity thereof, and a low cost thereof, such that the organic photovoltaic may be manufactured at a low cost, as compared to the existing solar cell. However, the organic photovoltaic has a problem that a structure of BHJ is degraded by moisture in air or oxygen to rapidly decrease the efficiency thereof, that is, a problem in the stability of the solar cell. When a technology of completely sealing the solar cell is introduced in order to solve this problem, the stability may be increased, but a cost may also be increased.

As a method of solving a problem of the DSSC by the liquid electrolyte, an all-solid state DSSC using Spiro-OMeTAD[2,22',7,77'-tetrkis (N,N-di-p-methoxyphenylamine)-9,99'-spirobi fluorine], which is a solid state hole conductive organic material rather than the liquid electrolyte to have efficiency of 0.74% was reported in Nature (Vol 395, p. 583) in 1998 by Michael Gratzel, a chemistry professor at EPFL in Switzerland, who is an inventor of the DSSC. Afterward, the efficiency was increased up to about 5.0% by optimizing the structure, improving interfacial properties, and improving hole conductivity. In addition, a solar cell using the inexpensive pure organic dye instead of the ruthenium based dye and using P3HT, PEDOT, or the like as a hole conductor has been manufactured, but efficiency of the solar cell is still low, at 2 to 4%. Recently, a fact that a cell using SQ1{5-carboxy-2-[[3-[(1,3-dihydro-3,3-dimethyl-1-ethyl-2H-indol-2-ylidene)methyl]-2-hydroxy-4-oxo-2-cyclobuten-1-ylidene]methyl]-3,3-trimethyl-1-octyl-3H-indolium} dye absorbed in a nanotubular $TiO_2$ and using P3HT as the hole conductor may have maximum efficiency of 3.2% has been reported [Nano Letters, 9, (2009) 4250]. However, there was a problem in the stability of the cell such as a problem that efficiency of the cell was reduced by half after 3 days, or the like.

Further, research into a solar cell using quantum dot nanoparticles as a light absorber rather than the dye and using hole conductive inorganic material or organic material rather than the liquid electrolyte has been reported. A fact that a cell using CdSe (CdTe surface coating) as the quantum dot and using spiro-OMeTAD as the hole conductive organic material has efficiency of about 1.8% at weak light (1/10 of the solar light intensity) has been reported [Nano letters, 9, (2009) 4221]. In this case, the cell has excessively low efficiency in addition to a problem generated by using CdSe which contains toxic Cd.

In addition, a fact that a solar cell using $Sb_2S_3$ as a light absorbing inorganic material and using CuSCN as the hole conductive inorganic material has efficiency of 3.37% has been reported [J. Phys. Chem. C, 113 (2009) 4254]. However, in this case, the CuSCN, which is an inorganic hole conductor, and $Sb_2S_3$, which is a light absorber, are reacted with each other to generate CuS, which causes efficiency to be rapidly decreased as time goes by.

The reasons why the quantum dot nano particle is used as the light absorber in the solar cell field are as follows. 1) A thickness of a photo electrode required to completely absorb the solar light in a sensitized solar cell may be reduced due to a high light absorption coefficient. 2) Since light absorption band gap may be easily controlled by controlling composition or a particle size of the quantum dot nano particle, the quantum dot nano particle may be utilized as a light-sensitive material absorbing up to near infrared light. 3) Multilayer coating of the quantum dot nano particle and hybridization thereof with the dye may be performed. 4) The photo current may be increased by multiple exciton generation, thereby making it possible to remarkably improve the efficiency. In addition, since the quantum dot nano particle is an inorganic material, the stability thereof for the light may be more excellent as compared to the dye made of an organic material.

However, each of the organic solar cell based on an organic semiconductor, the DSSC based on an organic/inorganic dye, and the inorganic solar cell based on an inorganic semiconductor has been individually researched up to now, but research into and development of "an all-solid state nano-structured inorganic-organic heterojunction solar cell" expected to have all of the high efficiency and the stability and be manufactured at low cost by combining an advantage of the inorganic thin-film solar cell capable of easily absorbing solar energy with a wide band from visible light to near infrared light and an advantage of the organic solar cell capable of being manufactured at low cost by a solution process with a structure of the DSSC that may be cheap and have high efficiency has not been conducted at all. Further, when a nano-encapsulated quantum dot of the inorganic semiconductor used in the present invention, an advantage of the quantum dot may be combined.

DISCLOSURE

Technical Problem

An object of the present invention is to provide a new solar cell capable of having high efficiency and excellent stability and being manufactured at low cost by improving a problem of a dye-sensitized solar cell (DSSC) caused by using a liquid electrolyte and an expensive ruthenium based dye, a problem of an organic solar cell of which efficiency is rapidly reduced in the air, and a problem of an inorganic thin-film solar cell manufactured using an expensive raw material and equipment and having an advantage of a solid state DSSC, an advantage of an inorganic semiconductor manufactured in solution or a quantum dot nano particle, and an advantage of the organic solar cell capable of being manufactured by a solution process, and a method of manufacturing the same.

More particularly, the object of the present invention is to provide a new solar cell capable of having high efficiency and excellent stability and being mass-produced using an inexpensive raw material and under alleviated process conditions by combining the DSSC, the organic solar cell, and an inorganic thin-film solar cell based on a semiconductor with each other, and a method of manufacturing the same.

Technical Solution

Hereinafter, a solar cell according to the present invention, and a method of manufacturing the same will be described in detail with reference to the accompanying drawings. The drawings to be provided below are provided by way of example so that the idea of the present invention can be sufficiently conveyed to those skilled in the art. Therefore, the present invention is not limited to the drawings to be provided below, but may be modified in many different forms. In addition, the drawings to be provided below may be exaggerated in order to clarify the scope of the present invention. Further, like reference numerals denote like elements throughout the specification.

Here, technical terms and scientific terms used in the present specification have the general meaning understood by those skilled in the art to which the present invention pertains unless otherwise defined, and a description for the known function and configuration obscuring the present invention will be omitted in the following description and the accompanying drawings.

The solar cell according to the present invention is a full solid-state solar cell in which a photo-anode, a sensitizer absorbing solar light to generate photoelectrons-photoholes, and a hole transporting layer are all solids. Further, in the solar cell according to the present invention has a heterojunction structure in which an organic material and an inorganic material form are combined with each other while forming an interface. In addition, the solar cell according to the present invention does not use a dye but uses an inorganic semiconductor as a light sensitive material. Further, the solar cell according to the present invention uses an organic photovoltaic material absorbing the solar light together with the inorganic semiconductor to generate an exciton as a hole transporting material.

Specifically, the solar cell according to the present invention uses a metallic oxide as an electron transporting material, uses an inorganic semiconductor as the sensitizer, and uses an organic photovoltaic material of the following Chemical Formula 1 as an organic hole transporting material.

[Chemical Formula 1]

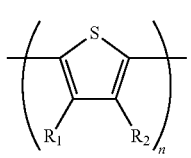

In Chemical Formula 1, $R_1$ and $R_2$ are each independently selected from hydrogen or C1 to C12 alkyl group, one of the R1 and R2 is C1 to C12 alkyl group, $R_1$ and $R_2$ are not hydrogen at the same time, and n is 2 to 10,000.

Specifically, the solar cell according to the present invention includes a porous inorganic electron-transporting layer containing metallic oxide particles; a sensitizer containing inorganic semiconductors; and an organic hole transporting layer containing an organic photovoltaic material of Chemical Formula 1.

The inorganic semiconductor is positioned between the electron transporting layer and the organic hole-transporting layer to interface-contact while forming heterojunction interfaces with each of the electron transporting layer and the organic hole-transporting layer, wherein the organic hole transporting layer may additionally absorb solar light that is not absorbed in the inorganic semiconductor sensitizer to generate the exciton and transport the hole.

The inorganic semiconductor, which is the sensitizer, means an inorganic semiconductor material absorbing the solar light to generate a photoelectron-photohole pair, and preferably, an inorganic semiconductor capable of efficiently separating and transporting the exciton generated by light by having a low band gap and a high light absorption coefficient to efficiently absorb the solar light and positioned between the electron transporting layer and the organic hole transporting layer to have excellent energy band matching between each of the components.

The band gap means a gap between a conduction band of the inorganic semiconductor material and a valence band thereof, and means a band gap depending on unique characteristics of a material or a band gap changed from the unique characteristics of the material according to a size of nano particles by quantum-confinement effect in the case in which the size of particle is small.

The sensitizer containing the inorganic semiconductor includes a film shaped discontinuous layer in which inorganic semiconductor particles are discontinuously connected with each other and a film-shaped continuous layer in which inorganic semiconductor particles are continuously connected with each other. The inorganic semiconductor particles means nano-sized particles (including a quantum dot) having the quantum-confinement effect, that is, means particles having an average size of several nm to several tens nm, and preferably, an average size of 0.5 to 10 nm.

In the case in which the sensitizer contains the inorganic semiconductor particles, a plurality of inorganic semiconductor particles are uniformly distributed to be attached to the metallic oxides of the electron transporting layer. More specifically, in the case in which the sensitizer contains the inorganic semiconductor particles, the inorganic semiconductor contacts a surface of the inorganic electron transporting layer including a surface by the pore of the porous inorganic electron transporting layer. A state in which the inorganic semiconductor contacts the surface of the inorganic electron transporting layer includes a state in which the inorganic semiconductor is attached to the inorganic semiconductor particles of the inorganic electron transporting layer while forming a two-dimensional interface.

In the case in which the sensitizer includes the discontinuous layer of the inorganic semiconductor particle, the sensitizer including the discontinuous layer includes a state in which the inorganic semiconductor particles do not contact adjacent inorganic semiconductor particles while forming a grain boundary and are separated from each other. In addition, in the sensitizer including the discontinuous layer, the inorganic semiconductor particle contacts at least one adjacent inorganic semiconductor particle while forming the grain boundary and the pores separating the inorganic particles from each other are uniformly present between the inorganic semiconductor particles, such that entirely, the sensitizer has a film shape configured of the inorganic semiconductor nano particles and includes a porous structure in which pore penetrating through the film are present.

In the case in which the sensitizer includes the continuous layer of the inorganic semiconductor particle, the sensitizer including the continuous layer has a structure in which the inorganic semiconductor particles contact all of the adjacent inorganic semiconductor particles while forming the grain boundaries to thereby be continuously connected with inorganic semiconductor particles and entirely has a film shape. In this case, the continuous layer includes a dense film in which pores are not present, a film in which closed pores are present at triple points of grain boundaries, or a film in which pores penetrating through the film in a thickness direction are partially non-uniformly present.

The inorganic semiconductor contacts the surface of the porous electron transporting layer, wherein the surface of the electron transporting layer includes the surface of opened pores of the porous electron transporting layer. A state in which the inorganic semiconductor provided in the surface by the opened pore includes a state in which the inorganic semiconductor contacts the metallic oxide particle in the pore of the porous electron transporting layer. The inorganic semiconductor is provided in the surface of the electron transporting layer, such that the inorganic semiconductor contacts the metallic oxide particle of the electron transporting layer and contacts the organic hole transporting material filled in the pore of the electron transporting layer.

The organic hole transporting layer (material) means an organic material absorbing the solar light to generate the exciton and moving the hole, and preferably, an organic material in which a difference between highest occupied molecular orbital (HOMO) energy level (hereinafter, HOMO level) and lowest unoccupied molecular orbital (LUMO) energy level (hereinafter, LUMO level) is 0.5 to 3.5 eV, which may absorb the solar light. More preferably, the organic hole transporting layer (material) is an organic material of the following Chemical Formula 1.

[Chemical Formula 1]

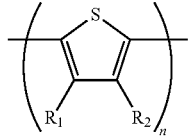

In Chemical Formula 1, $R_1$ and $R_2$ are each independently selected from hydrogen or C1 to C12 alkyl group, one of the R1 and R2 is C1 to C12 alkyl group, $R_1$ and $R_2$ are not hydrogen at the same time, and n is 2 to 10,000.

The porous electron transporting layer means a shape in which the metallic oxide particle or metallic oxide rods which is an inorganic material contact each other while having opened pores. The porous structure of the electron transporting layer necessarily includes an opened pore structure and may further include a partially closed pore structure. The inorganic semiconductor is positioned at the pore of the electron transporting layer, and the pore of the electron transporting layer at which the inorganic semiconductor is positioned is filled with the hole transporting material. Therefore, the hole transporting layer has a structure in which the hole transporting layer cover an upper portion of the electron transporting layer and fills the opened pore of the electron transporting layer to thereby be sunk into the pore.

As described above, in the solar cell according to the present invention, the electron transporting material is made of the inorganic material containing the metallic oxides, the sensitizer absorbing the solar light to generate the photoelectron-photohole pair is made of the inorganic semiconductor rather than the dye, and the hole transporting material is made of the organic material containing the organic photovoltaic material of Chemical Formula 1 additionally absorbing the solar light that is not absorbed in the inorganic semiconductor sensitizer to generate the exciton of the photoelectron-photohole pair and forms an interphase interface with the inorganic semiconductor sensitizer present in the upper portion of the inorganic electron transporting layer, and cascade type energy matching in which the hole separated from the inorganic semiconductor sensitizer may be transported and the self-generated exciton may be again separated is formed therein.

The solar cell according to the present invention uses the inorganic semiconductor type sensitizer used in the inorganic thin-film solar cell rather than the organic dye of a dye-sensitized solar cell (DSSC) and uses a p-type organic semiconductor material configuring an active layer of the organic solar cell as the hole conductive material to have a structure in which advantages of each of the solar cell are combined, such that the solar cell according to the present invention may have high efficiency, facilitate treatment thereof, be thermally, optically, chemically, and physically stable, and be mass-produced using an inexpensive raw material and under alleviated process conditions.

The solar cell according to the present invention uses the inorganic semiconductor as the sensitizer and uses the organic photovoltaic material of Chemical Formula 1 as the organic hole transporting material, such that the inorganic semiconductor (sensitizer) and the hole transporting material (hole transporting layer) complementarily absorb the solar light to generate photoelectron-photohole pair.

The photoelectron generated in the inorganic semiconductor is separated and moves to the electron transporting layer, and the photoelectron generated in the organic photovoltaic material is separated and moves to the inorganic semiconductor (and/or the electron transporting layer).

Exciton generated by solar light absorption of the hole transporting material of Chemical Formula 1 is separated from heterojunction interfaces (a heterojunction interface between the inorganic semiconductor of the sensitizer and the hole transporting material and/or a heterojunction interface between the metallic oxides of the electron transporting layer and the hole transporting material), and then the photoelectron moves to the outside of the cell through the inorganic semiconductor of the sensitizer and metallic oxide particle; or the metallic oxide particle; and the photohole may move through its own medium (hole transporting material) to additionally generate the photo current, thereby making it possible to further improve efficiency.

Particularly, the photoelectron generated in the inorganic semiconductor (sensitizer) moves to the inorganic electron transporting layer and the photohole generated in the inorganic semiconductor (sensitizer) moves to the hole transporting layer containing the organic photovoltaic material, such that the photoelectron and photohole are separated from each other. In addition the exciton (A state in which the photoelectron-photohole generated in the organic photovoltaic material are not separated from each other was referred to as the exciton) generated in the organic photovoltaic material is separated into the photoelectron and photohole at the interface between the inorganic semiconductor and the organic photovoltaic material (hole transporting layer), and then the photoelectron moves to the inorganic semiconductor (sensitizer) and the photohole moves through the hole transporting material (its own medium).

More specifically, each of the sensitizer (inorganic semiconductor) and the hole transporting layer complementarily absorb the solar light to generate the photoelectron-photohole pair, wherein the photoelectron-photohole pair generated in the sensitizer (inorganic semiconductor) is separated and moves through the electron transporting layer and hole transporting layer, and the photoelectron-photohole pair generated in the hole transporting layer is separated from each other at the interface between the sensitizer and the hole transporting layer, and then the photoelectron moves to the electron transporting layer through the sensitizer and the photohole moves through the hole transporting layer.

As the solar cell according to the present invention has a structure in which the hole transporting layer (hole transporting material) fills the opened pore of the porous electron transporting layer, the hole transporting layer (hole transporting material) contacts the electron transporting layer (metallic oxides) that is not the sensitizer, wherein in the photoelectron-photohole pair generated in the hole transporting layer (hole transporting material), the photoelectron is separated therefrom at the interface between the hole transporting layers (hole transporting material) and moves to the electron transporting layer and the photohole moves to the hole transporting layer.

In the solar cell, as each of the sensitizer and the hole transporting layer complementarily absorb the solar light, the solar cell has second solar light absorption spectra by the organic photovoltaic material of the hole transporting layer together with first solar light absorption spectra by the sensitizer.

Therefore, the solar cell according to the present invention may absorb solar light of wider wavelength band, and solar light that is not absorbed in the sensitizer is not lost to the outside of the solar cell but be absorbed in the hole transporting layer, thereby making it possible to absorb a larger amount of solar light from the same light intensity.

Further, in the case in which the sensitizer is made of the nano particles having the quantum-confinement effect, spectra of the solar light having wide wavelength band may be uniformly absorbed according to a material of the nano particle, an average particle size thereof, and particle size distribution thereof.

In order to further absorb the solar light having a predetermined light intensity, absorb wider wavelength band of the solar light, and absorb more uniformly per each wavelength in the configuration of the present invention in which the solar light is complementarily absorbed in each of the sensitizer and the hole transporting material, a central wavelength of an absorption peak of the first solar light absorption spectra is preferably 350 to 650 nm, and a central wavelength of an absorption peak of the second solar light absorption spectra is preferably 550 to 800 nm.

The solar cell according to the present invention further includes first and second electrodes facing each other, wherein a lower portion of the electron transporting layer (a lower portion based on FIGS. 1A to 1C) may be provided with the first electrode and an upper portion of the hole transporting layer (an upper portion based on FIGS. 1A to 1C) may be provided with the second electrode.

In the case in which the first and second electrodes are provided, the photoelectron generated in the sensitizer moves to the first electrode through diffusion of a conduction band of the electron transporting layer, and the photohole generated in the sensitizer moves to the second electrode through the hole transporting layer, the photoelectron generated in the hole transporting layer moves to the first electrode through the sensitizer and the electron transporting layer, and the photohole generated in the hole transporting layer moves to the second electrode through its own medium (hole transporting layer).

The solar cell according to the present invention further includes a metallic oxide thin-film formed between the first electrode and the electron transporting layer, and accordingly, may have a structure in which the first electrode, the metallic oxide thin-film, the electron transporting layer are sequentially laminated. The metallic oxide thin-film prevents the hole transporting material filling the pore of the electron transporting layer and the first electrode from contacting each other and induces a smooth flow of the electron moving through the electron transporting layer. In view of the smooth flow of the electron, the metallic oxide of the metallic oxide thin-film is preferably the same material as that of the electron transporting layer (metallic oxide particle).

As describe above, the solar cell according to the present invention uses the inorganic semiconductor as the light sensitive material rather than the dye in the DSSC, uses the organic photosensitive material of Chemical Formula 1 absorbing the solar light complementarily with the inorganic semiconductor to generate the exciton as the hole transporting material, and has a well-defined percolation structure in which the surface of the porous electron transporting layer configured of the metallic oxide particle and having the opened pore and an inner portion of the opened pore are provided with the inorganic semiconductor so as to contact the metallic oxide particle and the organic photosensitive material fills the pore of the porous electron transporting layer, such that energy conversion efficiency is 5% or more using artificial solar light energy having a light intensity of 100 mW/cm$^2$ (1 sun) and is almost constant regardless of a change in the light intensity.

Based on an example shown in FIGS. 1A to 1C, a structure of the solar cell according to the present invention will be described in detail. As shown in FIG. 1A, the solar cell according to the present invention is preferably configured to include a first electrode 10, a porous electron transporting layer 30 formed on the first electrode and including a plurality of metallic oxide particles 31 providing moving paths of electrons, a sensitizer including inorganic semiconductors 40 contacting the metallic oxide particles of the electron transporting layer and absorbing solar light to generate a photoelectron-photohole pair, a hole transporting layer including organic photovoltaic material absorbing the solar light to generate exciton, filling the pore of the porous electron transporting layer 30, and covering one surface of the electron transporting layer, and a second electrode 60 formed on the hole transporting layer 50 so as to face the first electrode.

The electron transporting layer 30 providing the moving path of the photoelectron is configured to include the plurality of metallic oxide particles 31 to have a porous structure having opened pores. In a structure in which an inner portion of the pore of the porous electron transporting layer 30 having the opened pore structure is provided with the sensitizer 40 contacting the metallic oxide particle 31 and the hole transporting layer 50 filling gaps of the porous electron transporting layer 30, a light sensitive region at which the light may be absorbed may be maximized similarly to a percolation structure of the organic solar cell, and separation efficiency of the exciton generated in the hole transporting material filling the opened pores of the porous electron transporting layer 30 may be increased.

In order to smoothly move the electron through the metallic oxide particle 31 together with maximizing the light sensitive region and the separation efficiency of the exciton generated in the hole transporting material, a specific surface area of the inorganic electron transporting layer is preferably 10 to 100 m$^2$/g. The specific surface area is a specific surface area at which the electron may smoothly move, electron annihilation may be suppressed at the time of moving of the electron through the electron transporting layer 30, a large amount of sensitizer 40 may be loaded, the light sensitive region may be increased, the photoelectron and photohole may be smoothly separated at an interface between the metallic oxide particle 31 and the hole transporting material 50 or an interface between the inorganic semiconductor 40 and the hole transporting material 50 before the exciton generated in the hole transporting material 50 is annihilated. More specifically, the specific surface area of 10 to 100 m$^2$/g is a specific surface area at which the opened pore of the porous electron transporting layer 30 may be filled with the organic photovoltaic material, and as both of the inorganic semiconductor 40 and the hole transporting layer 50 absorb the solar light to generate the photoelectron-photohole pair, smooth transportation of the photohole generated in the inorganic semiconductor 40, smooth transportation of the photoelectron through the metallic oxide particle 31, the photohole generated in the organic voltaic material filling the opened pore may be performed, and efficiency of the solar light absorption of the solar cell may be improved.

In addition, a thickness of the porous electron transporting layer 30 configured of the metallic oxide particle 31 may be 0.1 to 5 μm in view of high photovoltaic efficiency and a smooth flow of the photo current. When the thickness of the porous electron transporting layer 30 is thinner than 0.1 μm, an amount of inorganic semiconductors 40 formed in the porous electron transporting layer 30 may be reduced, such that efficiency of the cell may be reduced, and when the thickness of the porous electron transporting layer 30 is thicker than 5 μm, a moving distance of the photo current generated in the inorganic semiconductor 40 and the hole transporting layer 50 is increased, such that the efficiency of the cell may be reduced.

The inorganic electron transporting layer 30 is made of at least one material selected from $TiO_2$, $SnO_2$, ZnO, and $Nb_2O_5$, and preferably $TiO_2$ in view of high electron mobility and preventing electron annihilation. The metallic oxide particle 31 is a particle of at least one material selected from $TiO_2$, $SnO_2$, ZnO, $WO_3$, and $Nb_2O_5$, and preferably $TiO_2$ in view of the high electron mobility and preventing the electron annihilation.

The inorganic semiconductor 40, which is the sensitizer, is provided on the surface of the porous electron transporting layer 30 or in the pore thereof, and surface-contacts the metallic oxide particle 31 to form the interface. As the metallic oxide particle 31 and the inorganic semiconductor 40 surface-contact each other to form an interphase-boundary, a built-in potential is formed between the inorganic nano particle 30 and the inorganic electron transporting layer 30, such that an electric field by the built-in potential is formed based on the interphase-boundary. Separation of the photoelectron-photohole pair is more smoothly performed by the electric field, and recombination of the photoelectron-photohole is prevented, such that the efficiency of the cell is improved.

The sensitizer is preferable at least one material selected from CdS, CdSe, CdTe, PbS, PbSe, $Bi_2S_3$, $Bi_2Se_3$, InP, $InCuS_2$, $In(CuGa)Se_2$, $Sb_2S_3$, $Sb_2Se_3$, $SnS_x(1{\le}x{\le}2)$, NiS, CoS, $FeS_y(1{\le}y{\le}2)$, $In_2S_3$, MoS, MoSe, and an alloy thereof, and more preferably, is at least one material selected from $Bi_2S_3$, $Bi_2Se_3$, InP, $InCuS_2$, $In(CuGa)Se_2$, $Sb_2S_3$, $Sb_2Se_3$, $SnS_x(1{\le}x{\le}2)$, NiS, CoS, $FeS_y(1{\le}y{\le}2)$, $In_2S_3$, MoS, MoSe, and the alloy thereof that may be environmental friendly, have a relatively narrow band gap to greatly absorb the solar light, and be sufficient resources to thereby be inexpensive.

Here, as described above, the sensitizer is preferably made of at least one material selected from CdS, CdSe, CdTe, PbS, PbSe, $Bi_2S_3$, $Bi_2Se_3$, InP, $InCuS_2$, In (CuGa) $Se_2$, $Sb_2S_3$, $Sb_2Se_3$, $SnS_x(1{\le}x{\le}2)$, NiS, CoS, $FeS_y(1{\le}y{\le}2)$, $In_2S_3$, MoS, MoSe, and an alloy thereof, and more preferably, is at least one material selected from $Bi_2S_3$, $Bi_2Se_3$, InP, $InCuS_2$, In (CuGa) $Se_2$, $Sb_2S_3$, $Sb_2Se_3$, $SnS_x(1{\le}x{\le}2)$, NiS, CoS, $FeS_y(1{\le}y{\le}2)$, $In_2S_3$, MoS, MoSe, and the alloy thereof, and have a structure of a plurality of nano particles separated from each other, a discontinuous layer of the nano particles, or a continuous layer.

The hole transporting layer 50 fills the pore of the porous electron transporting layer 30 and is provided so as to cover a surface of the porous electron transporting layer 30 on which the second electrode are formed so that the electron transporting layer 30 and the second electrode 60 are separated from each other.

As described above, the hole transporting layer 50 (hole transporting material) contains organic photovoltaic materials, the organic photovoltaic material may be a conjugated polymer, and more particularly, be a conjugated polymer absorbing the solar light to generate the exciton, wherein in the conjugated polymer, a difference between HOMO level and LUMO level is 0.5 to 3.5 eV.

More specifically, the organic photovoltaic material has a feature of the following Chemical Formula 1 and is preferably at least one material from P3HT[poly(3-hexylthiophene)], P3AT[poly(3-alkylthiophene)], P3OT[poly(3-octylthiophene, and PEDOT:PSS [Poly(3,4-ethylenedioxythiophene)poly(styrenesulfonate)].

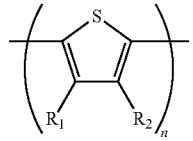

[Chemical Formula 1]

In Chemical Formula 1, $R_1$ and $R_2$ are each independently selected from hydrogen or C1 to C12 alkyl group, one of the $R_1$ and $R_2$ is C1 to C12 alkyl group, R1 and R2 are not hydrogen at the same time, and n is 2 to 10,000.

In the solar cell according to the present invention using the inorganic semiconductor 40 and the electron transporting layer 30 of the metallic oxide, the organic photovoltaic material of Chemical Formula 1 absorbs the solar light complementarily with the inorganic semiconductor 40 to generated a large amount of exciton, suppresses the exciton annihilation generated in the hole transporting material, allows the photohole generated in the hole transporting material and the inorganic semiconductor to smoothly move, and prevents the hole annihilation at the time of moving.

The second electrode 60 is at least one material selected from gold (Au), silver (Ag), platinum (Pt), palladium (Pd), copper (Cu), aluminum (Al), and a composite thereof and is provided on the hole transporting layer 50.

Here, although not shown, a junction layer containing a polythiophene based organic photovoltaic material improving bonding strength between the second electrode 60 and the hole transporting layer 50 may be provided therebetween.

FIG. 1B is shows another example of the solar cell according to the present invention. The solar cell according to the present invention further includes a metallic oxide thin-film 20 provided under the electron transporting layer 30 as shown in FIG. 1B. Here, the material of the metallic oxide thin-film 20 is preferably the same material as that of the metallic oxide particle 31 of the electron transporting layer 30.

As the hole transporting material 50 fills the pore in the electron transporting layer 30 having an opened pore structure, the metallic oxide thin-film 20 is provided in order to separate the hole transporting material 50 and the first electrode 10 from each other and serves to allow the hole transporting material 50 and the first electrode 10 not to contact each other. The metallic oxide thin-film 20 having a dense structure may have the same material that of the metallic oxide particle 31 of the electron transporting layer 30, and particularly, at least one material selected from $TiO_2$, $SnO_2$, ZnO, $WO_3$, and $Nb_2O_5$.

In order to provide a smooth moving path of the electron between the first electrode 10 and the electron transporting layer 30 and prevent the hole of the hole transporting layer 50 from moving to the first electrode 10, a thickness of the metallic oxide thin-film 20 is preferably 30 nm or more, and substantially, is 50 to 100 nm.

FIG. 2 shows another preferable example of the solar cell according to the present invention. Here, the solar cell according to the present invention further includes a transparent substrate 70, and the opposite surface of the surface at which the first electrode 10 contacts the metallic oxide thin-film 20 or the opposite surface of the surface at which the second electrode 60 contacts the hole transporting material 50 is provided with the transparent substrate 70.

As shown in FIG. 2, the transparent substrate 70 is provided at a portion on which solar light (sunlight of FIG. 2) is incident to physically/chemically protect the cell from the outside. The electrode (first electrode or second electrode) at the portion at which the transparent substrate 70 is provided may be a transparent electrode, and the transparent electrode contains fluorine doped tin oxide (FTO) or indium doped tin oxide (ITO).

Here, as shown in FIG. 2, the first and second electrodes 10 and 60 are connected to an external load (load in FIG. 2), voltage generated in the solar cell may perform work due to a photovoltaic effect.

FIG. 3 shows another preferable example of the solar cell according to the present invention and shows the case of the solar cell according to the present invention includes the sensitizer 40' having a continuous layer structure in which inorganic semiconductor particles adjacent to each other are form a grain boundary to physically contact each other, such that the inorganic semiconductor particles (NP of FIG. 3) are continuously connected to each other.

In the case in which the sensitizer 40' is configured of the continuous layer of the inorganic semiconductor, a loading amount of the inorganic semiconductor (sensitizer) loaded in the solar cell may be maximized, and the interphase boundary area at which the built-in-potential is formed between the electron transporting layer and the sensitizer may be maximized, such that the separation efficiency of the photoelectron-photohole may be increased by the electric field of the built-in-potential, and the recombination of the separated photoelectron-photohole may be effectively prevented.

As shown in FIG. 3, in the case in which the sensitizer 40' is configured of the continuous layer of the inorganic semiconductor, most of the hole transporting material 50 forms the interphase boundary with the inorganic semiconductor. Therefore, most of the photoelectrons generated in the hole transporting layer move the first electrode through the continuous layer of the inorganic semiconductor and the electron transporting layer.

FIG. 4 is a conceptual diagram showing the energy levels between the electron transporting layer 30 containing the metallic oxide particle 31, the inorganic semiconductor 40 that is sensitizer, and the hole transporting layer 50 containing the organic photovoltaic material.

As shown in FIG. 4, band gap energy of the electron transporting layer 30 is larger than band gap energy of the inorganic semiconductor 40, and the photoelectron generated in the inorganic semiconductor 40 is injected into a conduction band of the metallic oxide particle 31 of the electron transporting layer 30 by a potential difference between the conduction bands of the inorganic semiconductor 40 and the electron transporting layer 30 (difference in Ec level between electron transporting layer and nano particle in FIG. 4)

Further, the hole transporting layer 50 having hole conduction has HOMO potential higher than a valence band of the inorganic semiconductor 40 (Ev level of the nano particle of FIG. 4) in order to effectively conduct the photohole remaining after the inorganic semiconductor 40 surface-contacting the electron transporting layer 30 to attach thereto injects the photoelectron into the conduction band of the electron transporting layer 30, such that the photohole generated in the inorganic semiconductor 40 may spontaneously move to the hole transporting layer 50 by a potential difference (difference between Ev level of nano particle and HOMO level of FIG. 4).

In addition, for spontaneously moving the photoelectron generated by absorbing the solar light in the hole transporting layer itself to the inorganic semiconductor 40, the hole transporting layer 50 has a LUMO potential (LUMO level of FIG. 4) higher than the conduction band of the inorganic semiconductor (Ec level of the nano particle of FIG. 4), the photoelectron generated in the hole transporting layer 50 may spontaneously move to the inorganic semiconductor 40 by a potential difference (a difference between Ec level of the nano particle and LUMO level of FIG. 4).

The first electrode 10 preferably has a Fermi level lower than the conduction band of the electrode transport layer 30 (Ec level of the electron transporting layer of FIG. 4), and the second electrode 60 preferably has a Fermi level higher than the HOMO potential of the hole transporting layer 50 (HOMO level of FIG. 4).

The metallic oxides, the inorganic semiconductor, and the hole conductive organic photovoltaic material described above with reference to FIGS. 1A to 3 may be materials satisfying the energy band relationship therebetween described above with reference to FIG. 4. In an example of the solar cell according to the present invention described above based on FIGS. 1A to 4, $TiO_2$ particle may be used as the metallic oxide particle, $Sb_2S_3$ may be used as the inorganic semiconductor, and poly(3-hexylthiophene) (P3HT) may be used as the hole transporting material. In this case, fluorine-doped tin oxide, $(SnO_2: F)$ (FTO) may be used as the first electrode, and gold (Au) may be used as the second electrode.

Hereinafter, a method of manufacturing the solar cell according to the present invention.

The method of manufacturing the solar cell according to the present invention is performed to include a) applying slurry containing metallic oxide particles and heat-treating the applied slurry to form a porous electron transporting layer; b) forming inorganic semiconductor on a surface of the metallic oxide particle of the porous electron transporting layer; and c) impregnating a solution containing an organic photovoltaic material of Chemical Formula 1 into the porous electron transporting layer formed with the inorganic semiconductor to form a hole transporting layer.

Based on FIGS. 5A to 5F, a preferable method of manufacturing the solar cell according to the present invention will be described. Preferably, the method of manufacturing the solar cell according to the present invention is performed to include applying the slurry containing metallic oxide particles 31 to an upper portion of a first electrode 10 or the first electrode 10 laminated on a transparent substrate 70 and heat-treating the applied slurry to form a porous electron transporting layer 30 (electron transporting layer forming operation), forming an inorganic semiconductor sensitizer 40 absorbing solar light to generate photoelectron-photohole pairs on the surface of the metallic oxide particle of the porous electron transporting layer 30 (sensitizer forming operation), and applying an organic solution in which hole conductive organic photovoltaic material absorbing the solar light to generate excitons is dissolved to the porous electron transporting layer 30 formed with the inorganic semiconductor sensitizer 40 (hole transporting layer forming operation), and preferably is performed to further include forming a second electrode 60 on the hole transporting layer 50 (counter electrode forming operation).

More preferably, in the method of manufacturing the solar cell according to the present invention, the forming a metallic oxide thin-film 20 on the first electrode 10 (thin-film forming operation) is further performed as shown in FIG. 5B before the electron transporting layer forming operation is performed as shown in FIG. 5C. The thin-film forming operation may be performed by a chemical or physical deposition method generally used in a semiconductor process and be performed by a spray pyrolysis method (SPM). Here, the metallic oxide of the metallic oxide thin-film 20 is preferably the same material as that of the metallic oxide particle 31 of the electron transporting layer 30.

In the electron transporting layer forming operation (S10) of FIG. 5C, the slurry containing the metallic oxide particle is used, wherein the slurry may be applied by at least one method selected from a screen printing method; a spin coating method; a bar coating method; a gravure coating method; a blade coating method; and roll coating method.

The metallic oxide particle is a particle of at least one material selected from $TiO_2$, $SnO_2$, ZnO, $WO_3$, and $Nb_2O_5$, and preferably $TiO_2$.

At least one factor selected from a density of the slurry, pressure applied to the slurry at the time of application, an average size of metallic oxide particle contained in the slurry, particle size distribution of the metallic oxide particle contained in the slurry, a heat-treating temperature, and a heat-treating time may be controlled so that a specific surface area of the electron transporting layer manufactured by drying the slurry applied in the electron transporting layer forming operation and then heat-treating the dried slurry is 10 to 100 $m^2/g$.

The factors significantly affecting the specific surface area of the electron transporting layer and an opened pore structure are the average size of the metallic oxide particle and the heat-treating temperature at which the heat-treating is performed in order to form the electron transporting layer, and preferably, the average size of the metallic oxide particle is 5 to 100 nm, and the heat-treating is performed at 200 to 550° C. in the air.

An application thickness of the slurry may be controlled so that a thickness of the electron transporting layer manufactured by drying the slurry applied in the electron transporting layer forming operation and then heat-treating the dried slurry 0.1 to 5 μm.

At the time of forming of the electron transporting layer, a post-processing operation of impregnating the porous electron transporting layer with a metal precursor-dissolved solution containing the metal element of the metallic oxide particle may be further performed.

Preferably, the metal precursor in the post-processing operation is metal halide including metal chloride, metal fluoride, and metal iodide, the metal precursor-dissolved solution is a solution in which the metal precursor is dissolved in a low concentration of 10 to 40 mM, and after the impregnation is performed for 6 to 18 hours, the substrate is separated and recovered.

In the post-processing, when the porous electron transporting layer manufactured by applying the slurry containing the metallic oxide particle and then heat-treating the applied slurry is left in significantly weak metal precursor-dissolved solution, a significantly small metallic oxide particle is generated by hydrolysis with the passage of time even at room temperature to thereby be attached to the porous electron transporting layer.

Significantly fine metallic oxide particles (post-processing particles) generated by this post-processing is present between particles of the porous electron transporting layer having relatively many defects, such that a flow of the electrons of the electron transporting layer having a porous structure may be improved, the efficiency of the cell may be increased by preventing the electron annihilation, and an attaching amount of the sensitizer may be increased by increasing the specific surface area of the electron transporting layer.

In the post-processing operation, after the impregnation with the metal precursor-dissolved solution is performed, the heat-treating may be performed, and the heat-treating after the impregnation with the metal precursor-dissolved solution is performed preferably at 200 to 550° C. in the air. More preferably, the heat-treating performed after the post-processing is continuation of the heat-treating for forming the electron transporting layer, wherein the continuation of the heat-treating means that the heat-treating for forming the electron transporting layer is stopped in the middle, the heat-treated electron transporting layer is impregnated with the metal precursor-dissolved solution for a predetermined time and then is separated from the solution and recovered, and again the heat-treating for forming the electron transporting layer is performed.

The sensitizer forming operation of FIG. 5D may be performed by at least one method selected from a method of applying of colloidal nano particle dispersion solution (an attaching method by absorption); a spray pyrolysis method (SPM); a chemical bath deposition method (CBD); and a successive ionic layer adsorption and reaction method (SILAR), and more preferably may be performed by at least one method selected from the CBD and the SILAR in order to easily form the surface-contact between the metallic oxide particle and the inorganic semiconductor and form the inorganic nano particles uniformly distributed in the surface of the porous electron transporting layer and internal pores.

The inorganic semiconductor (sensitizer) is manufactured in a film shape in which the inorganic semiconductor covers the surface of the electron transporting layer in addition to surfaces of a plurality of particles separated from each other or pores. Preferably, the inorganic semiconductor (sensitizer) has a film shape of a continuous or discontinuous layer covering the surface of the metallic oxide particle forming the electron transporting layer.

In order to form the film of the inorganic semiconductor, preferably, the b) operation may be performed by at least one method selected from the CBD and the SILAR, and in order to form a homogeneous and dense continuous layer having a uniform thickness, the operation may be performed using the CBD.

In the case of the SILAR, after precursors of elements configuring the inorganic semiconductor are dissolved to prepare precursor solutions, respectively, the first electrode on which the porous electron transporting layer is formed is alternately dipped into each of the precursor solutions, and then washed, which is a unit process. In the case of SILAR, the repeating number of unit processes is controlled, thereby manufacturing each of the inorganic semiconductors attached to the surface of the metallic oxide particle in an island shape, or the inorganic semiconductor forming the film on the surface of the metallic oxide particle. As the precursor, chloride, iodide, fluoride, nitride, an organic material or an inorganic material may be used. For example, in the case in which the inorganic semiconductor is $Sb_2S_3$, as a precursor of Sb, $Sb_2S_3$ is dissolved in a chelate former such as tartaric acid, and as a precursor of S, $Na_2S_2O_3$ is mainly used.

In the case of CBD, after precursors of elements configuring the inorganic semiconductor are dissolved to prepare precursor solutions, respectively, each of the precursor solutions is mixed to prepare a mixing solution, and then the first electrode on which the porous electron transporting layer is formed is impregnated with the mixing solution, thereby manufacturing the sensitizer. In this case, concentrations of the precursor of the mixing solution or a impregnation time with the mixing solution is controlled, thereby manufacturing each of the inorganic semiconductors attached to the surface of the metallic oxide particle in an island shape, or the inorganic semiconductor forming the film on the surface of the metallic oxide particle. As the precursor, chloride, iodide, fluoride, nitride, an organic material or an inorganic material may be used. For example, in the case in which the inorganic semiconductor is $Sb_2S_3$, Sb-chloride is used as a precursor of Sb, a sulfur-containing organic material or sulfur-containing inorganic material is used as a precursor of S, and preferably, $Na_2S_2O_3$ is used as the sulfur-containing inorganic material, and the CBD is preferably performed at a temperature of 10° C. or less.

The inorganic semiconductor manufactured in the sensitizer forming operation is preferable at least one material selected from CdS, CdSe, CdTe, PbS, PbSe, $Bi_2S_3$, $Bi_2Se_3$, InP, $Sb_2S_3$, $Sb_2Se_3$, $SnS_x (1 \le x \le 2)$, NiS, CoS, $FeS_y (1 \le y \le 2)$, $In_2S_3$, MoS, MoSe, and an alloy thereof. In the case in which the inorganic semiconductor is present as particles, an average diameter of the particle is preferably 0.5 to 10 nm, and in the case in which the inorganic semiconductor is present as the discontinuous layer or continuous layer, the layer is a film configured of grains having the average diameter of 0.5 to 10 nm and has a thickness of 0.5 to 20 nm.

The hole transporting layer forming operation (S30) is a process of impregnating the solution containing the organic photovoltaic material so as to fill the gaps in the porous electron transporting layer 30 and cover the upper portion of the porous electron transporting layer 30. The impregnation is preferably performed by spin coating. A thickness of the organic photovoltaic material covering the electron transporting layer is preferably 30 to 200 nm based on the uppermost portion of the electron transporting layer 30.

The organic photovoltaic material having the hole conduction is a conjugated polymer, preferably a compound of the following Chemical Formula 1, and more preferably, is at least one material from P3HT[poly(3-hexylthiophene)], P3AT[poly(3-alkylthiophene)], P3OT[poly(3-octylthiophene, PEDOT:PSS [Poly(3,4-ethylenedioxythiophene) poly(styrenesulfonate)], and MEH-PPV[poly(2-methoxy-5-(2-ethyl-hexyloxy-1,4-phenylene vinylene]. The reason is to absorb the solar light to generate a large amount of exciton, to suppress the exciton annihilation generated in the hole transporting material, to allow the photohole generated in the hole transporting material and the inorganic nano particles to smoothly move, and to prevent hole annihilation at the time of moving.

[Chemical Formula 1]

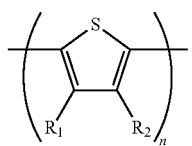

In Chemical Formula 1, $R_1$ and $R_2$ are each independently selected from hydrogen or C1 to C12 alkyl group, one of the $R_1$ and $R_2$ is C1 to C12 alkyl group, $R_1$ and $R_2$ are not hydrogen at the same time, and n is 2 to 10,000.

More preferably, in the method of manufacturing the solar cell according to the present invention, after the hole transporting layer 50 is formed by impregnation, forming a junction layer to improve the bonding strength between the second electrode 60 and the hole transporting layer 50 is further performed. The junction layer is formed by application of a solution containing polythiophene based organic photovoltaic material, and preferably, the application is a spin coating.

The second electrode 60 is manufactured using physical vapor deposition or chemical vapor deposition, and preferably, thermal evaporation.

Advantageous Effects

As set forth above, the present invention relates to an all-solid state nanostructured inorganic-organic heterojunction solar cell including the inorganic semiconductor (quantum dot nano particles, discontinuous layer, continuous layer are included therein) receiving the solar light to generate the photoelectron and photohole and the solid-state hole transporting organic material, and particularly, to an all-solid state nanostructured inorganic-organic heterojunction solar cell having a structure in which the known solid state nanostructured inorganic-organic heterojunction solar cell generating photoelectron and photohole using the inorganic semiconductor, providing spontaneous separation and moving path of the photoelectron using n-type semiconductor that does not absorb the light, and providing spontaneous separation and moving path of the photoelectron using the hole transporting organic material, and a heterostructured solar cell having the hole transporting organic material absorbing the remaining solar light that is not absorbed in the inorganic nano particle are fused.

More specifically, the solar cell according to the present invention may facilitate treatment thereof, not require post treatment such as sealing, be thermally, optically, chemically, and physically stable, and be mass-produced using an inexpensive raw material and under alleviated process conditions without using an expensive raw material such as ruthenium based dye, due to characteristics of an all solid-state.

More specifically, in the solar cell according to the present invention, energy conversion efficiency is 5% or more using artificial solar light energy having a light intensity of 100 $mW/cm^2$ (1 sun) and is almost constant regardless of a change in the light intensity.

In detail, the solar cell according to the present invention may minimize disadvantages of the existing dye sensitized solar cell and the organic solar cell and absorb the solar light with wider wavelength band, and solar light that is not absorbed in the sensitizer, which is the inorganic nano particle, may not be lost to the outside of the solar cell but be absorbed in the hole transporting layer, thereby making it possible to absorb a larger amount of solar light with the same light intensity.

DETAILED DESCRIPTION OF MAIN ELEMENTS

10: first electrode, 20: metallic oxide thin-film
30: electron transporting layer, 31: metallic oxide particle
40, 40' sensitizer, 50: hole transporting layer
60: second electrode

BEST MODE

Hereinafter, based on FIGS. 1A to 4, preparing examples according to the above-mentioned scope of the present invention will be described in more detail, but they are for experimentally demonstrating excellence of the present invention, and thus the present invention is not limited to preparing examples described below.

Preparing Example 1

Figure 5:
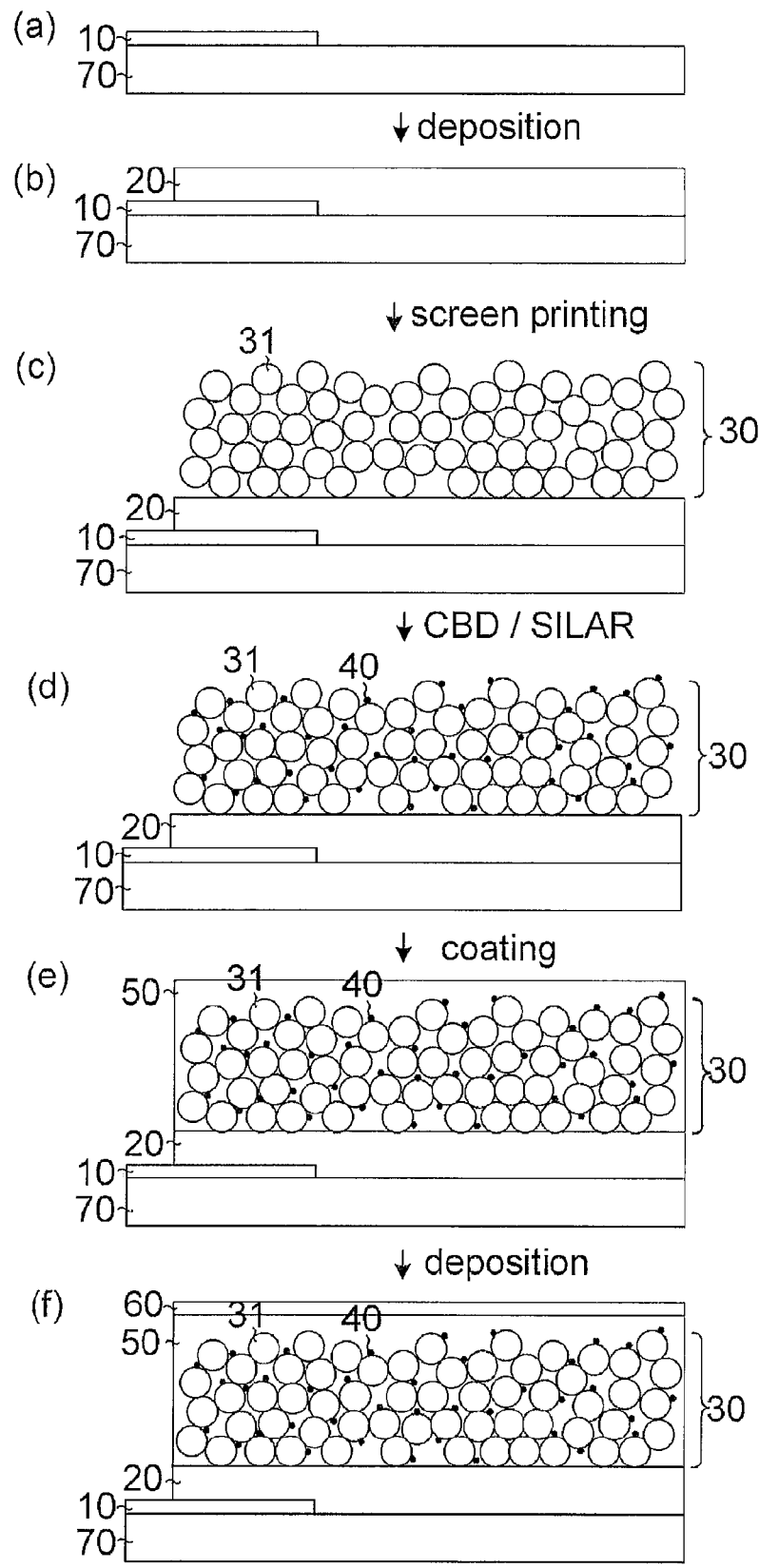
FIGS. 5A to 5F are diagrams showing a process of a method of manufacturing the solar cell according to the present invention.

After a glass substrate on which tin oxide containing fluorine (first electrode) is coated (fluorine-doped F-substrate) was cut at a size of 25×25 mm, end portions thereof were etched to partially remove FTO, similarly to FIG. 5.

A dense structured $TiO_2$ thin film having a thickness of 50 nm was prepared by a spray pyrolysis method (SPM) on the cut and partially etched FTO substrate as a recombination preventing film. The SPM was performed using a titanium acetylacetonate (TAA): EtOH(1:9 v/v %) solution, and a thickness was controlled by repeating a method of spraying the solution for 3 seconds and stopping for 10 seconds on the FTO substrate positioned on a hot plate maintained at a temperature of 450° C.

5 ml of ethyl cellulose solution in which 10 weight % of ethyl cellulose is dissolved in ethyl alcohol was added to $TiO_2$ powder having an average particle size of 60 nm (preparing by hydrothermal treatment of titanium perocomplex aqueous solution in which 1% is dissolved by weight based on $TiO_2$ for 12 hours at 250° C.) per 1 g of $TiO_2$, and 5 g of terpinol was added thereto per 1 g of $TiO_2$, to be mixed, followed by removing ethyl alcohol by a vacuum distillation method, thereby preparing a $TiO_2$ powder paste.

After the prepared $TiO_2$ powder paste was coated on the $TiO_2$ thin-film of the substrate by a screen printing method and heat-treated for 30 minutes at 500° C., the heat-treated substrate was dipped into $TiCl_4$ aqueous solution (20 mM) and left for 12 hours, followed by washing the substrate with deionized water and ethanol and drying. Then, the dried substrate was again heat-treated for 30 minutes at 500° C., thereby preparing a porous electron transporting layer having a specific surface area of 50 $m^2/g$ and a thickness of 1 μm.

A $Sb_2S_3$ sensitizer was prepared by a CBD of mixing first precursor solution obtained by dissolving 0.65 g of $SbCl_3$ (Junsei) in 2.5 mL of acetone and a second precursor solution obtained by dissolving 3. 95 g of $Na_2S_2O_3$(Aldrich) in 25 mL of ion exchanged water with each other to prepare a mixing solution, and then impregnating the substrate having the porous electron transporting layer formed thereon with the mixing solution to thereby be left for 1, 2, 3, or 4 hours at 10° C. or lower. The formed $Sb_2S_3$ sensitizer was annealed for 30 minutes at 330° C. under Ar atmosphere.

Figure 1:
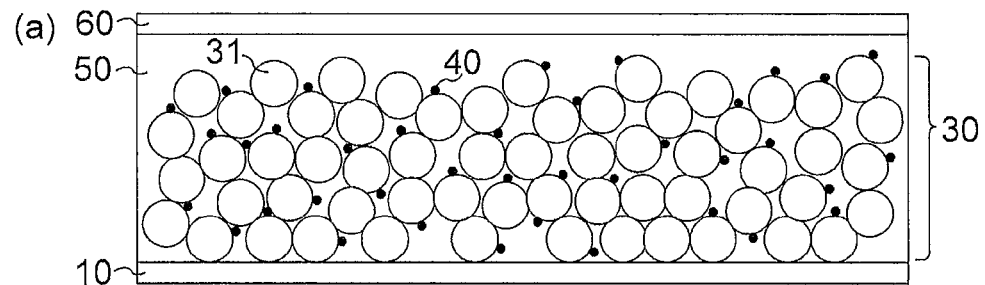
FIGS. 1A to 1C show an example of a cross-sectional structure of a solar cell according the present invention.
Figure 1:
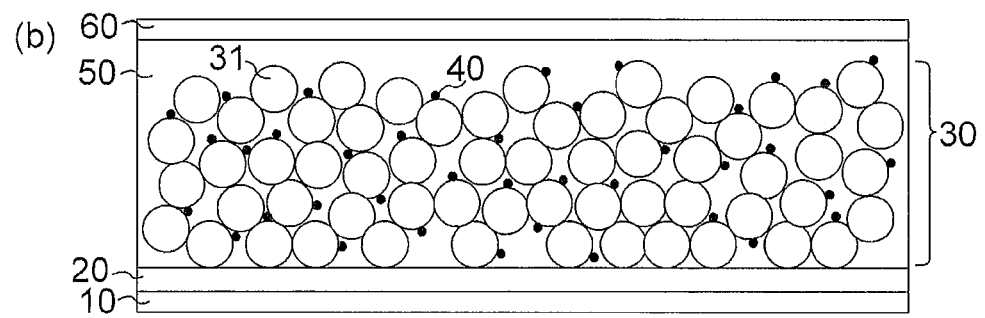
Figure 1:
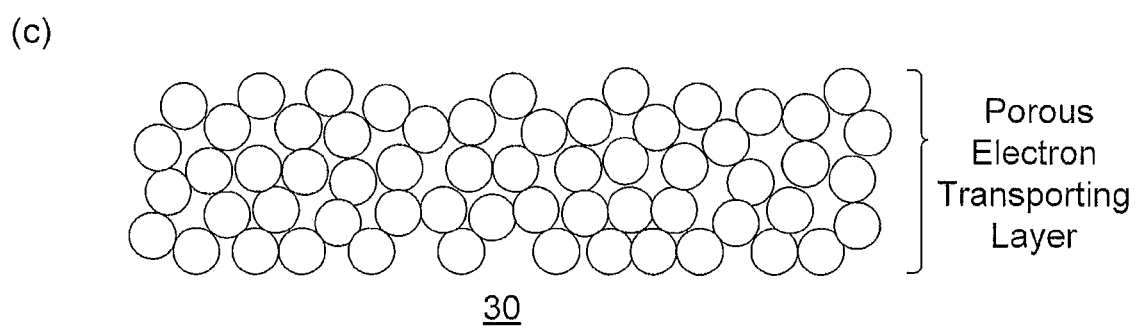
Figure 2:
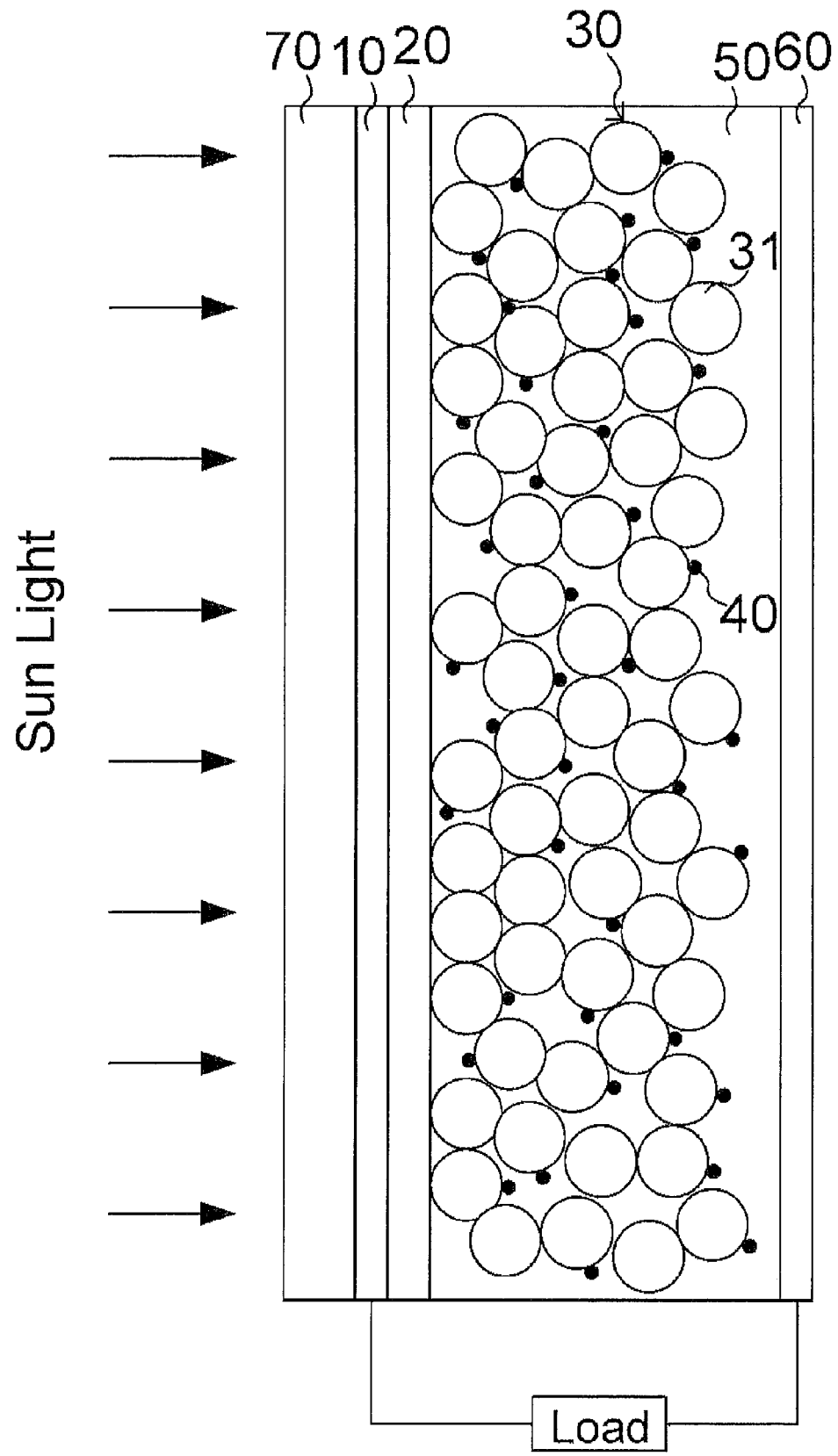
FIG. 2 shows another example of a cross-sectional structure of the solar cell according the present invention.
Figure 3:
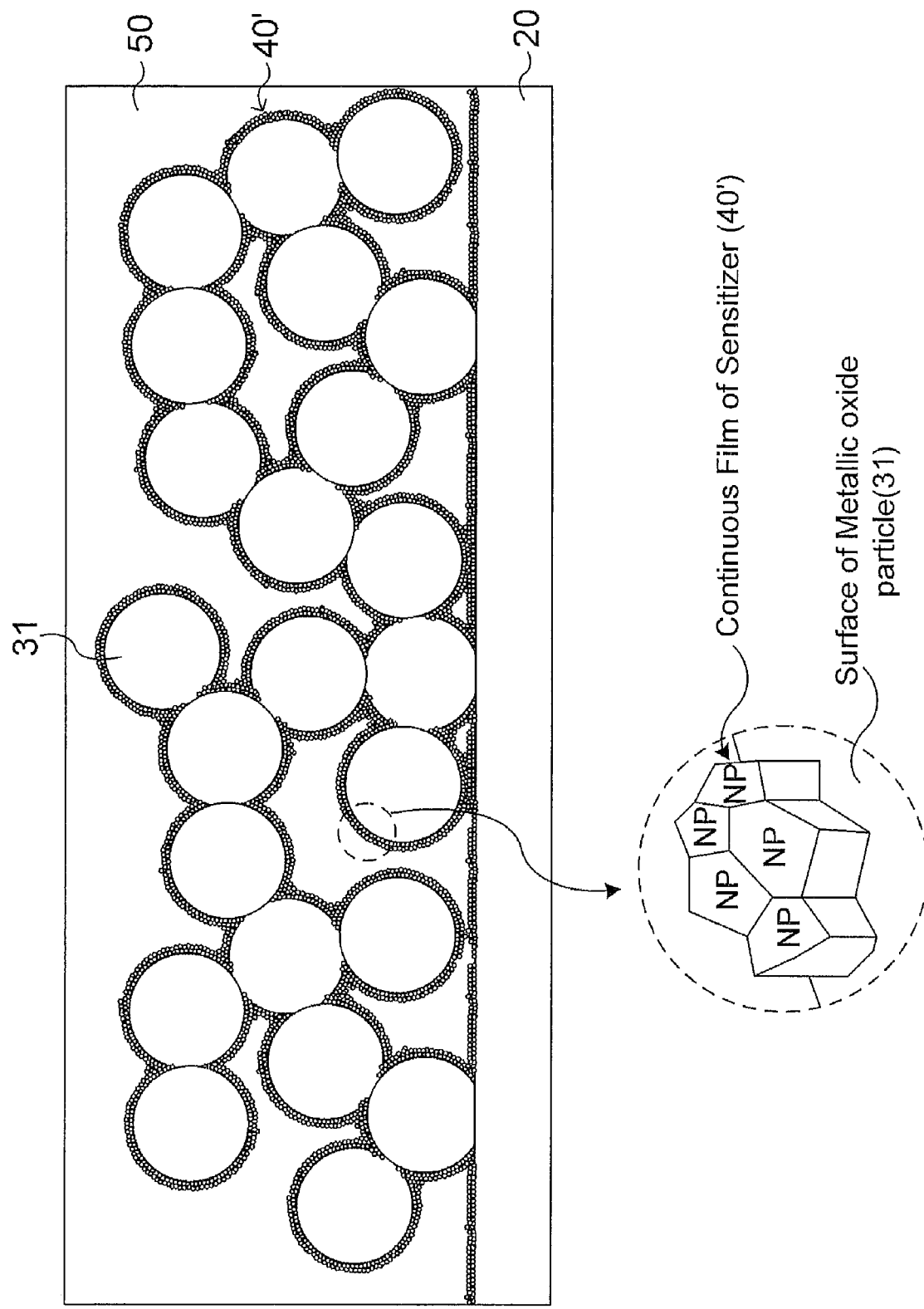
FIG. 3 shows still another example of a cross-sectional structure of the solar cell according the present invention.
Figure 4:
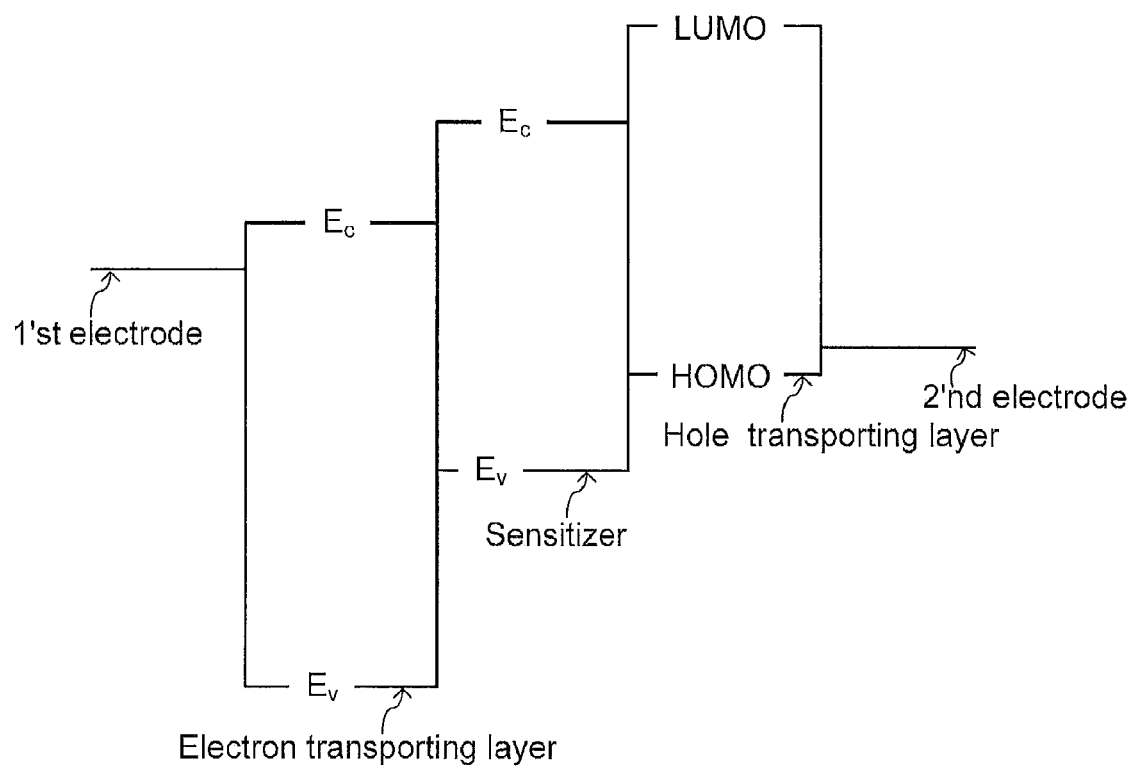
FIG. 4 is a conceptual diagram showing the energy levels between the electron transporting layer 30 containing the metallic oxide particle 31, the inorganic semiconductor 40 that is sensitizer, and the hole transporting layer 50 containing the organic photovoltaic material.
Figure 6:
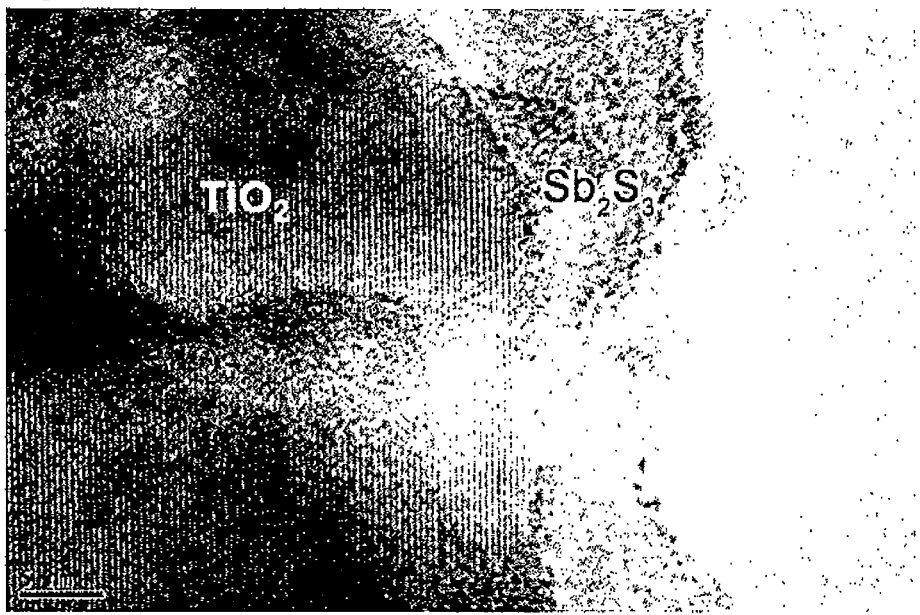
FIG. 6 is a transmission electron microscope (TEM) photograph of a sensitizer according to an impregnation time for forming $Sb_2S_3$ quantum dot in manufacturing examples according to the present invention.

FIG. 6 is a transmission electron microscope (TEM) photograph of a sensitizer formed by performing the CBD for 3 hours, and it may be appreciated that the sensitizer was prepared to form a continuous film on a surface of the metallic oxide particle configuring the porous electron transporting layer, similarly in FIG. 3.

A solution obtained by dissolving P3HT[poly(3-hexylthiophene), Aldrich], which is a hole conductive organic photosensitive material, in o-dichlorobenzene in a concentration of 15 mg/mL was spin-coated on the porous electron transporting layer formed with the sensitizer at 900 rpm for 10 seconds and at 2500 rpm for 50 seconds in two steps, such that the internal pores of the porous electron transporting layer was filled with P3HT, and an upper portion of the porous electron transporting layer was covered by P3HT. After the spin coating, heat-treatment was performed for 30 minutes at 90° C. Then, Au was vacuum deposited on an upper portion of a hole transporting layer using high vacuum ($5 \times 10^{-6}$ torr or less) thermal evaporator, thereby forming an Au electrode (second electrode) at a thickness of about 70 nm.

Preparing Example 2

After a glass substrate on which tin oxide containing fluorine (first electrode) is coated (fluorine-doped F-doped $SnO_2$, 8 ohms/sq, Pilkington, hereinafter, FTO substrate) was cut at a size of 25×25 mm, end portions thereof were etched to partially remove FTO similarly to FIG. 5.

A dense structured $TiO_2$ thin film having a thickness of about 50 nm was prepared by a spray pyrolysis method (SPM) on the cut and partially etched FTO substrate as a recombination preventing film. The SPM was performed using a titanium acetylacetonate (TAA):EtOH(1:9 v/v %) solution, and a thickness was controlled by repeating a method of spraying the solution for 3 seconds and stopping for 10 seconds on the FTO substrate positioned on a hot plate maintained at a temperature of 450° C.

5 ml of ethyl cellulose solution in which 10 weight % of ethyl cellulose is dissolved in ethyl alcohol was added to $TiO_2$ powder having an average particle size of 60 nm (preparing by hydrothermal treatment of titanium perocomplex aqueous solution in which 1% is dissolved by weight based on $TiO_2$ for 12 hours at 250° C.) per 1 g of $TiO_2$, and 5 g of terpinol was added thereto per 1 g of $TiO_2$, to be mixed, followed by removing ethyl alcohol by a vacuum distillation method, thereby preparing a $TiO_2$ powder paste.

After the prepared $TiO_2$ powder paste was coated on the $TiO_2$ thin-film of the substrate by a screen printing method and heat-treated for 30 minutes at 500° C., the heat-treated substrate was dipped into $TiCl_4$ aqueous solution (20 mM) and left for 12 hours, followed by washing the substrate with deionized water and ethanol and drying. Then, the dried substrate was again heat-treated for 30 minutes at 500° C., thereby preparing a porous electron transporting layer having a specific surface area of 50 $m^2/g$ and a thickness of 1 μm.

A $Sb_2S_3$ sensitizer was prepared by a CBD of mixing first precursor solution obtained by dissolving 0.65 g of $SbCl_3$ (Junsei) in 2.5 mL of acetone and a second precursor solution obtained by dissolving 3. 95 g of $Na_2S_2O_3$(Aldrich) in 25 mL of ion exchanged water with each other to prepare a mixing solution, and then impregnating the substrate having the porous electron transporting layer formed thereon with the mixing solution to thereby be left for 1, 2, 3, or 4 hours at 10° C. or lower. The formed $Sb_2S_3$ sensitizer was annealed for 30 minutes at 330° C. under Ar atmosphere.

A solution obtained by dissolving P3HT[poly(3-hexylthiophene), Aldrich], which is a hole conductive organic photosensitive material, in o-dichlorobenzene in a concentration of 15 mg/mL was spin-coated on the porous electron transporting layer formed with the sensitizer at 900 rpm for 10 seconds and at 2500 rpm for 50 seconds in two steps, such that the internal pores of the porous electron transporting layer was filled with P3HT, and an upper portion of the porous electron transporting layer was covered by P3HT. After spin coating, heat-treatment was performed for 30 minutes at 90° C. Next, a mixture obtained by mixing 1 ml of PEDOT:PSS [Poly(3,4-ethylenedioxythiophene)poly(styrenesulfonate)] solution (H C Stark; Baytron P VP AI 4083) with 2 mL of MeOH was spin coated on the P3HT layer at 2000 rpm for 30 minutes in order to increase a contact with the metal electrode. Then, Au was vacuum deposited on an upper portion of a hole transporting layer using high vacuum ($5\times10^{-6}$ torr or less) thermal evaporator, thereby forming an Au electrode (second electrode) at a thickness of about 70 nm.

Comparative Example

A comparative solar cell was prepared by the same method as that of the Preparing Examples except that the sensitizer by the CBD was not prepared in the Comparative Example.

In order to measure current-voltage characteristics of the prepared solar cell, an ORIEL class A solar simulator (Newport, model 91195A) and a source-meter (Kethley, model 2420) were used, external quantum efficiency (EQE) was measured using a 300W Xenon lamp (Newport), a monochromator (Newport cornerstone 260), and a multi-meter (Kethley model 2002).

As all measurements, values obtained by measuring the current-voltage characteristics and EQEs of four cells that are equally prepared 5 times per each cell to average the measured results.

It was confirmed that the solar cells prepared in Preparing Examples 1 to 2 have similar current-voltage characteristics and energy conversion efficiency of 5% or more using artificial solar light energy having a light intensity of 100 mW/cm$^2$, and the energy conversion efficiency thereof is almost constant regardless of a change in the light intensity. In the case in which a junction layer was formed of a material containing polythiophene based organic photovoltaic material as in Preparing Example 2, bonding strength between the electrode (second electrode) and the hole transporting layer was improved, such that durability of the cell was increased.

As the solar cells prepared in Preparing Examples 1 to 2 have similar photovoltaic characteristics, hereinafter, optical properties of the solar cell according to the present invention will be described based on optical properties of the solar cell prepared in Preparing Example in which physical durability of the cell was further increased.

Figure 7:
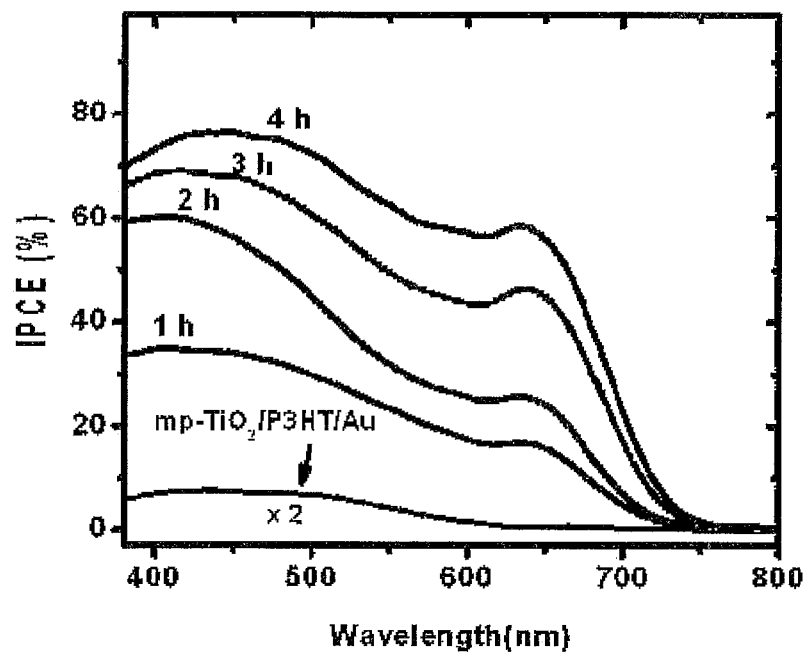
FIG. 7 shows results obtained by measuring incident photon to current conversion efficiency (IPCE) of a solar cell according to the present invention and a solar cell manufactured in a Comparative Example, FIG. 8 show results obtained by measuring current density (J) and potential (V) of the solar cell according to the present invention and the solar cell manufactured in a Comparative Example.

FIG. 7 shows results obtained by measuring incident photon to current conversion efficiency (IPCE) of the solar cell (hereinafter, TiO$_2$/Sb$_2$S$_3$/P3HT cell) according to an impregnation time (1, 2, 3, or 4 hours) for forming a Sb$_2$S$_3$ sensitizer in the above-mentioned Preparing Example and the solar cell (hereinafter, TiO2/P3HT cell) prepared in the Comparative Example. In FIG. 7, 1 h, 2 h, 3 h, and 4 h mean an impregnation time in a mixing solution for forming the Sb$_2$S$_3$ sensitizer.

It may be appreciated that the TiO$_2$/P3HT cell (mp-TiO$_2$/P3HT/Au of FIG. 7) has significantly low IPCE of 5% or less at 500 nm, but IPCE of the solar cell according to the present invention was rapidly increased as shown in FIG. 7.

It may be appreciated that the IPCE value is also increased as an amount of Sb$_2$S$_3$, which is a sensitizer, is attached to the porous electron transporting layer is increased, and IPCE value is the largest at 3 hour. However, it may be appreciated that IPCE is decreased at 4 hours. The reason may be that the hole conductive organic photovoltaic material insufficiently fills in the pore of the porous electron transporting layer by the excessively generated Sb$_2$S$_3$ and a thickness of the continuous layer of the inorganic nano particle become excessively thick to increase photocurrent annihilated by the recombination.

It may be appreciated that the prepared TiO$_2$/Sb$_2$S$_3$/P3HT cell (based on CBD impregnation time 3 hour) has IPCE of 70% or more at in a range of 350 to 530 nm and has IPCE of 76% at 430 nm, and it may be estimated that internal quantum efficiency (IQE) is 95% in consideration of a loss in the electrodes, or the like.

Figure 8:
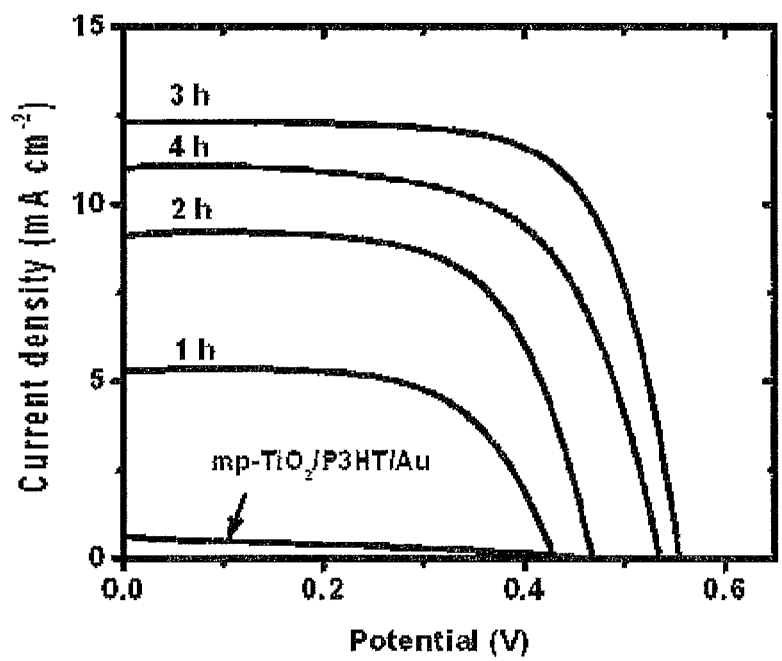

FIG. 8 shows results obtained by measuring current density (J) and potential (V) of the prepared TiO$_2$/Sb$_2$S$_3$/P3HT cell (based on CBD impregnation time 1 to 4 hours), wherein the results were measured at 1 sun (100 mW/cm$^2$). The following Table 1 shows the measured results of FIG. 8. Photovoltaic parameters such as open circuit voltage (V$_{oc}$) short-circuit current density (J$_{sc}$), fill factor (FF), and overall conversion efficiency (η, Eff. in Table 1.) were arranged and shown in Table 1. In the following Table 1, TiO$_2$/P3HT means the results of the cell prepared in Comparative Example, 1, 2, 3, and 4 means the results of TiO$_2$/Sb$_2$S$_3$/P3HT cell prepared by performing CBD for 1, 2, 3, and 4 hours.

TABLE 1

| CBD time (h) for Sb$_2$S$_3$ | J$_{sc}$ [mA cm$^{-2}$] | V$_{oc}$ [mV] | FF [%] | Eff. [%] |
| --- | --- | --- | --- | --- |
| TiO$_2$/P3HT | 0.63 | 475 | 29.2 | 0.092 |
| 1 | 5.3 | 424 | 64.1 | 1.48 |
| 2 | 9.1 | 465 | 65.5 | 2.92 |
| 3 | 12.3 | 556 | 69.9 | 5.06 |
| 4 | 11.0 | 535 | 63.8 | 3.97 |

It may be appreciated that the case of TiO$_2$/Sb$_2$S$_3$/P3HT cell prepared by performing CBD impregnation for 3 hours has significantly large current density of 12.6 mA/cm$^2$, and V$_{oc}$ of 556 mV, and Eff. thereof is 5% or more under a condition of 1 sun ((100 mW/cm$^2$), as shown in FIG. 8 and Table 1.

Figure 9:
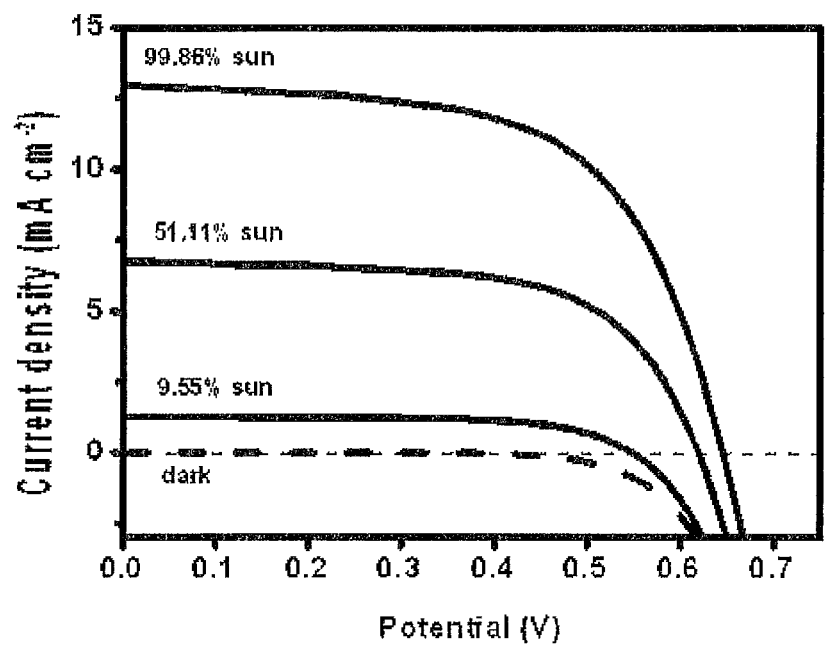
FIG. 9 is a current density-potential graph of the solar cell according to the present invention according to the irradiated light power.

FIG. 9 is a current density-potential graph showing the results measured by changing light power for TiO$_2$/Sb$_2$S$_3$/P3HT cell, and the following Table 2 shows the measured results of FIG. 9. Photovoltaic parameters according to the irradiated light intensity, such as V$_{oc}$, J$_{sc}$, FF, and Eff. were arranged and shown in Table 2.

TABLE 2

| Light power [mW cm$^{-2}$] | J$_{sc}$ [mA cm$^{-2}$] | V$_{oc}$ [mV] | FF [%] | Eff. [%] |
| --- | --- | --- | --- | --- |
| 99.84 | 13.02 | 645.74 | 61.0 | 5.13 |
| 51.11 | 6.74 | 619.75 | 63.6 | 5.20 |
| 9.49 | 1.28 | 549.06 | 66.1 | 4.88 |

It may be appreciated that EFF. is almost equal regardless of the irradiated light intensity and the solar cell according to the present invention is well-operated with stable efficiency as shown in FIG. 9 and Table 2.

Hereinabove, although the present invention is described by specific matters, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described examples and the following claims as well as all modified equally or equivalently to the claims are intended to fall within the scope and spirit of the invention.

The invention claimed is:

1. A method of manufacturing a solar cell comprising the steps of:
   a) applying slurry containing $TiO_2$ particles and heat-treating the applied slurry to form a porous electron transporting layer;
   b) forming $Sb_2S_3$ which is an inorganic semiconductor type sensitizer on a surface of the $TiO_2$ particles of the porous electron transporting layer using a chemical bath deposition method; and
   c) applying a solution containing P3HT [poly(3-hexylthiophene)] which is an organic photovoltaic material to the porous electron transporting layer formed with the inorganic semiconductor type sensitizer to form a hole transporting layer,
   wherein the pores of the porous electron transporting layer are filled with the P3HT, and the applied P3HT and the inorganic semiconductor type sensitizer contact each other, and
   wherein the hole transporting layer has a LUMO level higher than an Ec level which is the lowest energy level of the conduction band of the inorganic semiconductor type sensitizer, so that the photoelectron generated in the hole transporting layer spontaneously moves to the inorganic semiconductor type sensitizer.

2. The method of claim 1, wherein in the step (b), the inorganic semiconductor type sensitizer contacts a surface of the porous electron transporting layer including surfaces of pores.

3. The method of claim 1, further comprising:
   forming a metallic oxide thin-film on a first electrode before the step a);
   applying a solution containing PEDOT:PSS [Poly(3,4-ethylenedioxythiophene) poly(styrenesulfonate)] on the hole transporting layer to form a second hole transporting layer after performing the step (c); and
   forming a second electrode on a hole transporting layer after performing the step (c).

4. The method of claim 1, wherein the inorganic semiconductor type sensitizer forms a film covering a surface of the electron transporting layer including surfaces of pores.

5. The method of claim 1, wherein in the step a), the application is performed using slurry containing $TiO_2$ particles by at least one selected from a screen printing method, a spin casting method, a bar coating method, a gravure coating method, a blade coating method, and a rolling coating method.

6. The method of claim 1, wherein an average particle size of the $TiO_2$ particles is 0.5 to 10 nm.

7. The method of claim 1, wherein a specific surface area of the porous electron transporting layer is 10 to 100 $m^2/g$.

8. The method of claim 1, wherein a thickness of the porous electron transporting layer is 0.1 to 5 μm.

9. The method of claim 1, further comprising:
   a2) impregnating the porous electron transporting layer with a Ti precursor solution containing a metal atom of the metallic oxide particle and then heat-treating the impregnated porous electron transporting layer before the step (b).

10. The method of claim 9, wherein each of the heat-treating of the step a) and the heat-treating of step a2) is performed in the air at 200 to 550° C.

* * * * *